United States Patent [19]

Yamashiro

[11] 4,100,502

[45] Jul. 11, 1978

[54] CLASS B FET AMPLIFIER CIRCUIT

[75] Inventor: Osamu Yamashiro, Ohmiya, Japan

[73] Assignee: Hitachi, Ltd., Japan

[21] Appl. No.: 719,238

[22] Filed: Aug. 31, 1976

[30] Foreign Application Priority Data

Sep. 3, 1975 [JP] Japan .................................. 50-105919

[51] Int. Cl.² ............................................... H03F 3/16
[52] U.S. Cl. .................................... 330/264; 331/116 R
[58] Field of Search ............. 331/116 R, 114; 330/13,
330/35, 15, 38 M, 263, 264, 269, 277; 58/23

[56] References Cited

U.S. PATENT DOCUMENTS

| 2,791,644 | 5/1957 | Sziklai | 330/13 |
| 3,067,337 | 12/1962 | Bowman | 330/13 |
| 3,443,237 | 5/1969 | Prozeller | 330/13 |
| 3,566,145 | 2/1971 | Goodale | 330/13 |
| 3,676,801 | 7/1972 | Musa | 331/116 R |
| 3,760,584 | 9/1973 | Dargent | 331/116 R |
| 3,855,552 | 12/1974 | Thanhaeuser | 331/116 R |
| 3,953,875 | 4/1976 | Cave et al. | 330/38 M |

FOREIGN PATENT DOCUMENTS 1,395,337  5/1975  United Kingdom .................... 330/13

OTHER PUBLICATIONS

Electronics & Nucleonics Dictionary – Markus 1966, pp. 106–107, 3rd Ed.

Primary Examiner—John Kominski
Attorney, Agent, or Firm—Craig & Antonelli

[57] ABSTRACT

A complementary inverter amplifier circuit comprising a complementary inverter including a p-channel MIS FET connected to a first source potential, an n-channel MIS FET connected to a second source potential, the gate of the two FETs being applied with a common linear input, respective load resistors connected to the drains of the complementary FETs, an output being derived from the interconnection point of the load resistors or from the drains of the FETs, and a bias resistor connected between the gate and the drain of each of the complementary FETs, the input being supplied to the gates of the FETs through respective capacitors. The p-channel FET and n-channel FET are individually biased so that the circuit may serve as a class B push pull amplifier of low power consumption.

15 Claims, 8 Drawing Figures

VOLTAGE TRANSFER CHARACTERISTICS

CLASS B FET AMPLIFIER CIRCUIT

BACKGROUND OF THE INVENTION

1. FIELD OF THE INVENTION

This invention relates to an amplifier circuit and more particularly to a complementary metal-insulator-semiconductor (C-MIS) amplifier circuit comprising a p-channel metal-insulator-semiconductor field effect transistor (referred to as MIS FET or simply as FET, hereinbelow) and an n-channel MIS FET.

2. DESCRIPTION OF THE PRIOR ART

Conventionally, such a circuit as shown in FIG. 4 has been known as a crystal oscillator circuit used in an electronic wristwatch from U.S. Pat. No. 3,676,801 issued to F. H. Musa, an American publication, "RCA COS/MOS Integrated Circuits Manual" by RCA Corporation, pages 192 to 205, 1972, etc. The circuit of FIG. 4 basically comprises a C-MIS inverter circuit including an n-channel FET $M_n$ and a p-channel FET $M_p$, and a positive feedback circuit or a regenerative feedback loop connected between the input and output terminals of the inverter circuit and including a crystal oscillator X and capacitors $C_D$ and $C_G$. A resistor $R_D$ provided at the output of the amplifier circuit serves to stabilize the oscillation frequency.

Such a circuit as described above, however, has a problem in that the power consumption becomes large. This can be described as follows.

When the complementary inverter amplifier circuit constituting the main part of the oscillator circuit is driven with a completely digital input signal without other components, the period during which both complementary FETs are turned on is very short and the power consumption due to the dc current passing through the two FETs caused little problem since the complementary FETs operate in a push-pull manner. When a linear (e.g., a sinusoidal) signal as shown in FIG. 5 is applied to the input terminal, however, the period during which the two FETs operate in the transfer region or in the neighborhood of the switching point (the region between the threshold voltages $V_{thn}$ and $V_{thp}$ of the FETs $M_n$ and $M_p$, i.e., the hatched region Y in FIG. 5) becomes long and the power dissipation increases.

SUMMARY OF THE INVENTION

An object of this invention is, therefore, to provide a complementary inverter amplifier circuit of low power consumption.

Another object of this invention is to provide a complementary inverter amplifier circuit accompanied with no loss current through MIS FETs which occurs due to the threshold voltage of the MIS devices in the case of amplifying a linear input.

A further object of this invention is to provide a complementary MIS inverter amplifier circuit serving as a linear amplifier means in an oscillator circuit and having an arrangement of preventing a loss or invalid current through the inverter in supplying an oscillation output to a waveform shaping MIS inverter of the following stage.

Another object of this invention is to provide a complementary MIS inverter amplifier circuit capable of monolithic integration and adapted for use in the circuit requiring low power consumption such as a micropower crystal-controlled oscillator in an electronic timepiece such as an electronic wristwatch.

Another object of this invention is to provide a complementary MIS inverter amplifier circuit having a complementary MIS inverter biased to serve as a class B push-pull amplifier.

According to one aspect of this invention, there is provided a complementary inverter amplifier comprising a complementary inverter including a first FET of a first conductivity type connected to a first source potential and a second FET of a second conductivity type connected to a second source potential, an input being applied commonly to the gates of the first and the second FETs, the amplifier comprising a first and a second load resistors connected in series between the first and the second FETs, bias resistors connected between the gate and the drain of the first and the second FETs, an input being supplied to the gates of the FETs through respective capacitive elements and an output being derived from the interconnection point of the first and the second load resistors or from the drains of the first and the second FETs thereby providing a class B push-pull amplifier function.

These and other objects, features and advantages of the present invention will become more apparent from the following detailed description of the invention when taken in conjunction with the accompanying drawings.

BRIEF DESCRIPTION OF THE DRAWINGS

Throughout the drawings, the same reference letters or characters indicate the same parts.

DESCRIPTION OF THE PREFERRED EMBODIMENTS

Figure 1:
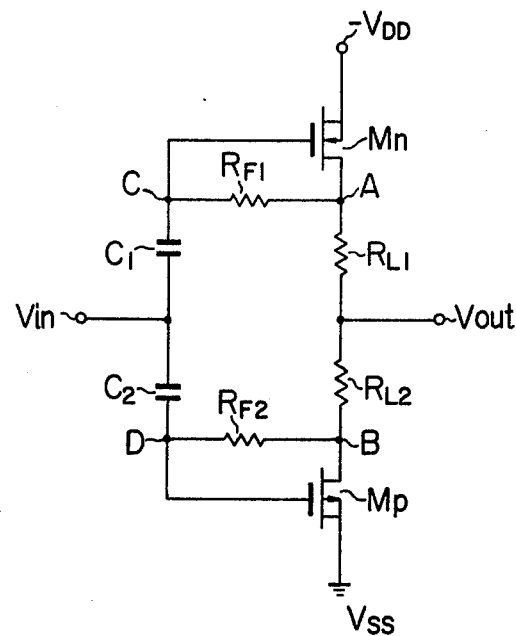
FIG. 1 is a circuit diagram of a complementary inverter amplifier according to an embodiment of this invention.

FIG. 1 shows a complementary inverter amplifier according to an embodiment of this invention, in which the circuit is arranged to operate as a class B push-pull amplifier by appropriately selecting the operational bias point of each of FETs $M_n$ and $M_p$ and to achieve reduction of the power consumption.

An n-channel enhancement mode FET $M_n$ (grounded source) connected to a potential source $-V_{DD}$ and a p-channel enhancement mode FET $M_p$ (grounded source) connected to a different potential source $V_{SS}$, ground in this example are connected in a series fashion to form a complementary inverter. Here, between the complementary FETs $M_n$ and $M_p$, two load resistors $R_{L1}$ and $R_{L2}$ of equivalent resistance are connected in series. Further, biasing resistors $R_{F1}$ and $R_{F2}$ are connected for the FETs $M_n$ and $M_p$ between the gate and the drain thereof, respectively. The gates of the FETS $M_n$ and $M_p$ are supplied with a common input signal $V_{in}$ through respective capacitors $C_1$ and $C_2$ for ac coupling. An output $V_{out}$ of the circuit is derived from the interconnection point of the load resistors $R_{L1}$ and $R_{L2}$. Letters C, D, A and B denote various points shown in the figure, i.e., the gates and drains of the FETs. The purposes of this invention can be achieved by the above structure as will be apparent from the following description of the operation of the circuit.

Figure 2:
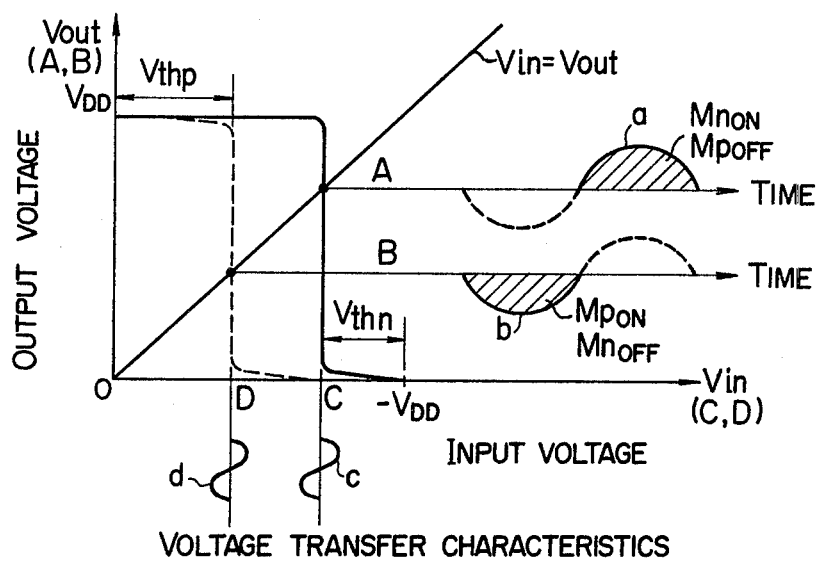
FIG. 2 shows voltage transfer characteristic curves for illustrating the operation of the circuit of FIG. 1.

In FIG. 2, the ordinate represents the output voltage of the FET and the abscissa the input voltage. The solid curve represents the relation between the voltages c and a at the gate C and the drain A of the FET $M_n$, i.e., the voltage transfer characteristic curve of the FET $M_n$, while the broken curve represents the relation between the voltages d and b at the gate D and the drain B of the FET $M_p$, i.e., the voltage transfer characteristic curve of the FET $M_p$. The biasing resistors $R_{F1}$ and $R_{F2}$ serve to equalize the dc levels of the gate and the drain voltages of the FETs $M_n$ and $M_p$, respectively. The lower the biasing resistance, the better stabilized is the biasing voltage, while the higher the biasing resistance, the higher held is the amplification factor. Considering these properties, the resistances of the biasing resistors $R_{F1}$ and $R_{F2}$ may be selected as approximately 10 megohms and may be formed of diffused resistors, polycrystalline Si resistors or on-resistances between the source and the drain of FETs. In detail, the biasing resistors $R_{F1}$ and $R_{F2}$ may be formed of on-resistances of a transmission gate of high resistance in the range of several to several tens megohms, which is formed of complementary MIS FETs to enable a monolithic integrated circuit form. The MIS FETs of the transmission gate are connected in parallel between the input and output terminals of the amplifier circuit. Here, the gate of the p-channel MIS FET is connected to the power supply voltage $-V_{DD}$ and the gate of the n-channel MIS FET to ground. Further, the higher is selected the resistance of the load resistors $R_{L1}$ and $R_{L2}$ compared to the on-resistance of the respective FETs, the steeper slope shows the voltage transfer characteristic curve and the closer the potential differential between the drain and the source (or gate-to-source) of each of the FETS $M_n$ and $M_p$ approaches the respective threshold voltage, the closer the biasing voltage approaches the threshold voltage, reducing the power consumption. Since the dc component in the input voltage $V_{in}$ is blocked by the ac coupling or dc blocking capacitors $C_1$ and $C_2$, the biasing points of the FETs $M_n$ and $M_p$ are determined separately and independently of the input signal level.

When an input signal $V_{in}$, e.g., a linear signal such as a sinusoidal wave by the oscillating operation, is applied, the voltages at the gate points as shown by C and D in FIG. 1, of the FETs $M_n$ and $M_p$ receiving the input signal through the respective capacitors $C_1$ and $C_2$ are represented by the curves c and d in FIG. 2 respectively. Then, the FETS $M_n$ and $M_p$ having operational points as described above provide amplified outputs a and b at the respective drain points as shown by A and B in FIG. 1. A total output may take the combination of these signals a and b.

Therefore, in the former half of the cycle the FET $M_p$ is turned on to generate a signal at the point B and in the latter half the FET $M_n$ is turned on the generate a signal at the point A. Namely, the output signal in the whole cycle has a waveform as shown by the hatched areas in FIG. 2. In this way, the two FETs of the complementary type take charge of the amplification in respective half cycles to totally perform the operation of a class B push-pull amplifier.

According to the above structure, the present circuit performs the class B push-pull operation and hence the period during which the two FETS are both turned on becomes short. Thus, the period of allowing a through-current to pass becomes short and the power consumption is greatly reduced.

The above analysis holds perfectly when the circuit operates ideally. In practical use, however, there remains a small possibility of momentarily allowing the turning-on of both FETs, i.e., the flow of a through-current, from the relation to the operational speed of the FETs even in the above circuit. In such a case, however, the through-current is limited in magnitude by the load resistors $R_{L1}$ and $R_{L2}$ and is almost negligible. Therefore, a complementary inverter amplifier of low power consumption is provided.

The present invention is not limited to the above embodiment and various alternations and modifications would be possible.

For example, the output of the above complementary amplifier is derived from the interconnection of the load resistors $R_{L1}$ and $R_{L2}$ connected in series between the conduction paths of the two FETS $M_n$ and $M_p$ in the above embodiment, but it may be replaced by those derived from the respective drains of the two FETs according to the use or purposes. An example of such a case is shown in FIG. 3 in which the inverter amplifier is used in an oscillator circuit.

Figure 3:
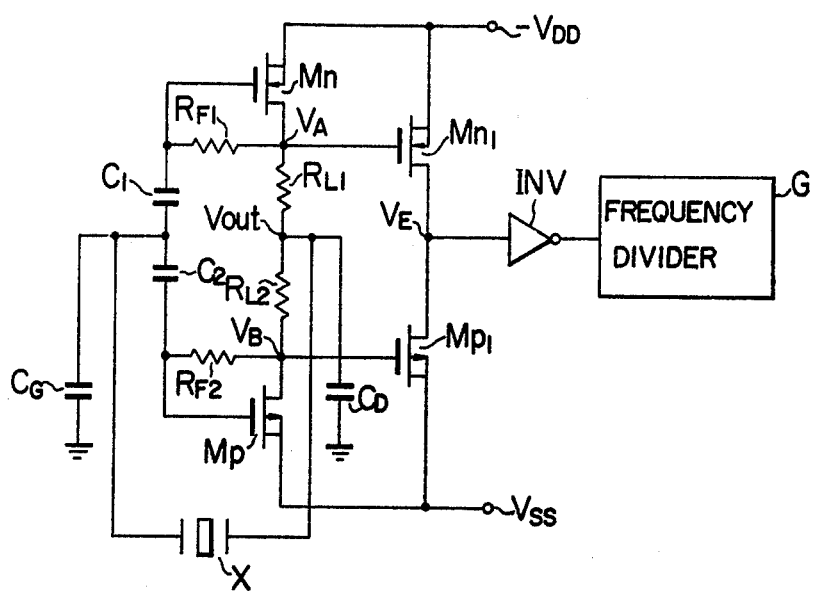
FIG. 3 is a circuit diagram of an oscillator circuit including an embodiment of the amplifier circuit according to this invention.
Figure 4:
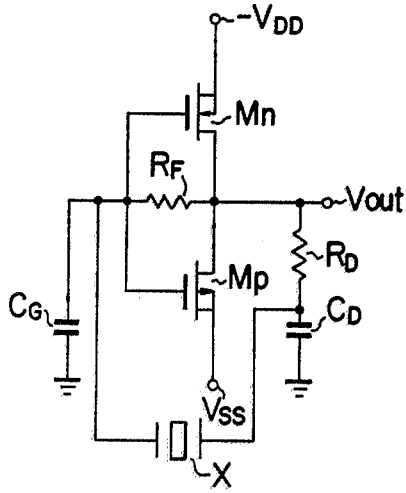
FIG. 4 is a circuit diagram of a conventional oscillator circuit.
Figure 5:
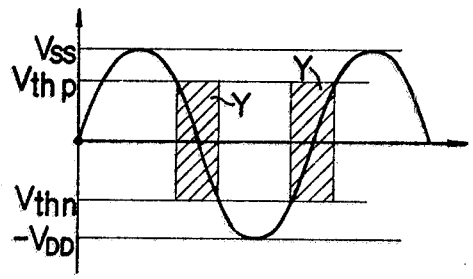
FIG. 5 is a graph for illustrating the reason for allowing a loss through-current in the conventional circuit of FIG. 4.

FIG. 3 shows a crystal-controlled oscillator circuit for use in an electronic wristwatch. The complementary inverter circuit according to an embodiment of this invention is used as the amplifier means and a positive feed-back circuit including a crystal oscillator X and capacitors $C_D$ and $C_G$ is connected between the input and output terminals of the amplifier. Generally, an output signal $V_{out}$ of this oscillator circuit is supplied to a frequency divider circuit through a waveform shaping inverter which is also called a logic circuit. Here, the following problem arises.

Since the load resistors $R_{L1}$ and $R_{L2}$ are provided in the complementary inverter of the oscillator circuit, the output $V_{out}$ of the oscillator resembles a sinusoidal wave. Therefore, if such a sinusoidal wave is directly applied to an inverter of the next circuit stage, a through-current is allowed to pass through the inverter for a long period to increase the power consumption.

Therefore, in the circuit of FIG. 3, the voltages $V_A$ and $V_B$ at the respective drains of the FETs $M_n$ and $M_p$ are derived as the outputs of the complementary amplifier and are applied to the gates of an n-channel FET $M_{nl}$ and a p-channel FET $M_{pl}$ of a complementary inverter, respectively, whose drain electrodes are connected in common to constitute an output terminal $V_E$. The source electrodes of the FETs $M_{nl}$ and $M_{pl}$ are connected to the operating potential sources $-V_{DD}$ and $V_{SS}$ respectively. The output of the complementary inverter is then supplied to a frequency divider G through a waveform shaping inverter INV. In this arrangement, two amplified output signals $V_A$ and $V_B$ are supplied to the gates of the corresponding FETs $M_{nl}$ and $M_{pl}$ of the complementary inverter in the next circuit stage. Then, since no load resistor is used in this complementary inverter, a square wave is provided at an output terminal $V_E$. Hence, the through-current in the waveform shaping inverter INV is minimized and an oscillator circuit of low power operation is provided.

Figure 6:
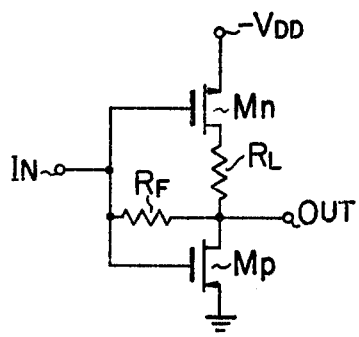
FIG. 6 is a circuit diagram of a complementary MIS FET amplifier according to another embodiment of this invention.

FIG. 6 shows a complementary MIS amplifier circuit according to another embodiment of this invention, in which an n-channel MIS FET $M_N$ and a p-channel MIS FET $M_P$ are connected in series between two operating voltage terminals, one at $-V_{DD}$ and the other at a reference level, e.g., ground. A resistor $R_L$ is connected between the drains of the MIS FETs $M_N$ and $M_P$ to suitably limit a current passing through the conduction paths of these FETs. A biasing resistor $R_F$ is coupled between an input terminal IN and an output terminal OUT of the amplifier. The bias point for the MIS FET $M_P$ which is set at a potential in the neighborhood of the threshold voltage $V_{th}$ of the MIS FET $M_P$ is shown by way of example. The gates of the complementary MIS FETs $M_N$ and $M_P$ are commonly in ac sense connected to the input terminal IN. Output deriving points and linear biasing of the circuit may be selected in various manners according to the need of the designer, for example, as shown in FIG. 1 or FIG. 3.

In this circuit, since the conduction current limiting resistor $R_L$ is provided in the drain side of the amplifier FET but not in the source side, a feed-back loop as in the latter case is not formed, so that the amplifier circuit can achieve low power consumption without substantially lowering its amplification, and also, the dispersion or variation in the amplification of the amplifier due to the manufacturing dispersion of the resistance of the resistor $R_L$ becomes small. Further, since the MIS FET $M_P$ is biased to operate as class B amplifier, low power dissipation is successfully achieved.

Figure 7:
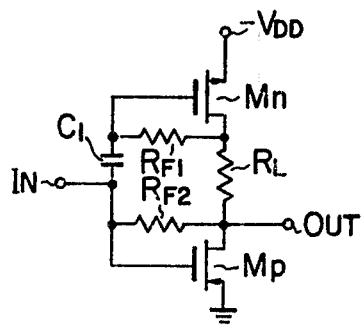
FIG. 7 is a circuit diagram illustrating a modification of FIG. 1.

FIG. 7 illustrates a modified circuit of FIG. 6 but similar to FIG. 1, in which no ac coupling capacitor is provided between the input terminal IN and the MIS FET $M_P$ and instead, this transistor is biased directly by the biasing resistor $R_{F2}$. Consequently, no attenuation of an ac input signal due to the ac coupling capacitor, which will be applied to the MIS FET $M_P$ will occur. Also, since the number of circuit components is reduced compared with the circuit of FIG. 1, it is advantageous to produce the circuit in an IC chip. The output terminal OUT may be provided at the drain of the MIS FET $M_N$.

Figure 8:
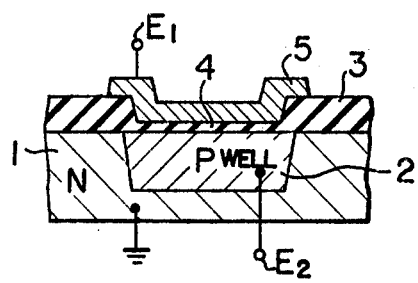
FIG. 8 is a sectional view of an MIS capacitor illustrating an ac coupling capacitor used in the present amplifier.

Capacitors for ac coupling capacitors $C_1$ and $C_2$ may be integrated in an MIS integrated circuit. Namely, an MIS capacitor for the capacitor $C_1$ or $C_2$ may be formed as shown in FIG. 8 using a so-called silicon-gate MOS process by which other transistors are fabricated in the same chip. In the MIS capacitive structure, a p-type semiconductor well region 2 is formed in an n-type semiconductor substrate 1 grounded to constitute one electrode of the capacitor. A silicon dioxide layer 3 is formed over the surface of the semiconductor substrate. On the surface of the well region 2 a thin silicon dioxide film 4 is formed, on which a polycrystalline silicon layer 5 is provided to constitute the other electrode of the capacitor. The electrode layer 5 is led to a terminal $E_1$. A p$^+$-type diffused region (not shown) is formed in the p-type well region 2 from which another terminal $E_2$ is formed through the silicon dioxide layer 3. Thus, the capacitor is formed of an MOS capacitance established between the p-type well region and the polycrystalline silicon layer 5, and is isolated from ground. The leadout p$^+$-type region is diffused in the well region 2 simultaneously with the step of diffusing source and drain regions for other MIS elements.

It will be apparent that in the amplifier circuits described above, the polarities of the FETs may be reversed with the inversion of the polarity of the power source potentials.

Further, any circuits and/or circuit elements may be added to the basic circuit structures of the above embodiments for operating the circuit more effectively.

This invention can be widely utilized as an amplifier circuit of low power consumption adapted for monolithic integration.

What we claim is:

1. An FET circuit comprising an amplifier stage and a waveform shaping stage; said amplifier stage including a first p-channel FET and a first n-channel FET, means for biasing the gate of each of said FETs at a dc level nearly equal to its drain potential, (means for setting the potential differential between the source and the drain of each of said FETS at a voltage nearly equal to its threshold voltage;) and means for supplying a linear input signal to said gates through respective capacitors; and said waveform shaping stage comprising means for converting a linear signal into a digital signal including a second p-channel FET having a gate coupled to the drain of said first p-channel FET, and a second n-channel FET having a gate coupled to the drain of said first n-channel FET.

2. An amplifier circuit comprising a complementary inverter including a first FET of a first conductivity type connected to a first source potential, a second FET of a second conductivity type connected to a second source potential, and an input terminal connected to the gates of said first and second FETs, the circuit comprising:

a series connection of first and second load resistors connected between said first and second FETs;
a respective bias resistor connected between the gate and the drain of each of said first and second FETs;
a respective capacitor connected between the input terminal and the gate of each of said FETs; and
output means connected to the drains of said FETs.

3. The amplifier circuit according to claim 2, in which said output means comprises a terminal connected to the interconnection point of said load resistors.

4. The amplifier circuit according to claim 2, in which said output means comprises a pair of terminals connected to the drains of said first and second FETs, respectively.

5. An amplifier circuit comprising, in combination,
first and second operating voltage terminals of different potential level;
first and second field effect transistors (FET) of complementary conductivity type, each having a source, a gate and a drain, the sources of said complementary FETs being connected to said first and second operating voltage terminals respectively, the gates of said complementary FETs being ac-coupled to an input terminal; and
a resistor connected between the drains of said complementary FETs, the connection between said resistor and said complementary FETs serving as an output terminal.

6. The amplifier circuit according to claim 5, further comprising a biasing resistor connected between the gate and the drain of at least one of said first and second FETs, the bias potential between the gate and the source of said FET being determined at a potential nearly equal to its threshold voltage.

7. The amplifier circuit according to claim 5, further comprising a first and a second biasing resistors connected between the gates and the drains of said first and second FETs respectively, and an ac coupling capacitor connected between the gate of said first FET and said input terminal, the input terminal being connected directly to the gate of said second FET.

8. A complementary push-pull amplifier comprising:
a p-channel FET having a source coupled to a positive power source terminal, a gate and a drain;
an n-channel FET having a source coupled to a negative power source terminal, a gate and a drain;
resistive means coupled between said drains of said FETs and;
means for applying an a.c. input signal to said gates of said FETs to operate said FETs in a push-pull mode.

9. The amplifier as defined in claim 8 further including means for applying to the gate of one of said FETs a bias voltage substantially equal to its drain d.c. potential.

10. The amplifier as defined claim 9 further including means for applying to the gate of the other FET a bias voltage substantially equal to its drain d.c. potential, and a d.c. blocking capacitor coupled between said gates of said FETs.

11. A complementary push-pull comprising a p-channel FET, an n-channel FET, resistive load means connected to at least one of said FETs, a resistive bias means coupled between the gate and drain of said one FET for applying a bias voltage substantially equal to the drain d.c. potential of said FET to said gate thereof, means for connecting said FETs and said resistive load means so that said resistive load means and the conduction paths between the sources and the drains of the respective FETs are connected in series and, means for applying an a.c. input signal to the gates of said FETs, the resistance of said load means being higher than the on-resistance of said one FET and the potential differential between the source and gate of said one FET approaching its threshold voltage.

12. The amplifier as defined in claim 11 comprising a d.c. blocking capacitor coupled between the gates of said FETs, resistive bias means coupled between the gate and drain of the other FET of applying a bias voltage substantially equal to the drain d.c. potential of the other FET to the gate thereof and, output deriving means wherein said load means is coupled between the drains of both FETs so as to act as a common load for both FETs, the resistance of said load means being higher than the on-resistance of the other FET and the potential differential between the source and gate of the other FET approaching its threshold voltage, said output deriving means deriving at least one output from the node between the drains of both FETs.

13. The amplifier as defined in claim 12 in which a single capacitor is connected between the gates of both FETs, said a.c. input signal being directly applied to the gate of one of said FETs and being applied to the gate of the other by way of said single capacitor.

14. A complementary FET circuit comprising an amplifier stage and a succeeding state, each being comprised of complementary FETs, said amplifier stage including means for producing two output signals having d.c. potentials different from each other in response to an input signal, said succeeding stage having two input terminals for receiving said two output signals.

15. The FET circuit as defined in claim 14, in which each of said stages comprises a p-channel FET and an n-channel FET, the respective potential differential between the source and the drain of each FET in said amplifier stage is supplied between the source and the gate of the corresponding FET in said succeeding stage, respectively, and said respective potential differential is substantially equal to the threshold voltage of that FET.

* * * * *